(12) United States Patent
He

(10) Patent No.: US 11,867,760 B2
(45) Date of Patent: Jan. 9, 2024

(54) PARAMETER SETTING METHOD AND APPARATUS, SYSTEM, AND STORAGE MEDIUM

(71) Applicant: CHANGXIN MEMORY TECHNOLOGIES, INC., Hefei (CN)

(72) Inventor: Hao He, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 246 days.

(21) Appl. No.: 17/442,263

(22) PCT Filed: Jun. 17, 2021

(86) PCT No.: PCT/CN2021/100579
§ 371 (c)(1),
(2) Date: Sep. 23, 2021

(87) PCT Pub. No.: WO2022/062490
PCT Pub. Date: Mar. 31, 2022

(65) Prior Publication Data
US 2023/0055833 A1 Feb. 23, 2023

(30) Foreign Application Priority Data
Sep. 27, 2020 (CN) .......................... 202011034937.2

(51) Int. Cl.
*G11C 7/00* (2006.01)
*G01R 31/3181* (2006.01)
(Continued)

(52) U.S. Cl.
CPC ... *G01R 31/31813* (2013.01); *G01R 31/2889* (2013.01); *G01R 31/318314* (2013.01)

(58) Field of Classification Search
CPC .......... G01B 31/31813; G01B 31/2889; G01B 31/318314
(Continued)

(56) References Cited

U.S. PATENT DOCUMENTS 6,268,735 B1  7/2001 Craig et al.
7,333,908 B2 * 2/2008 Johnson ........... G01R 31/31716
                                                    702/120

(Continued)

FOREIGN PATENT DOCUMENTS

CN    111399782 A    7/2020
CN    111627475 A    9/2020
TW    I474260 B      2/2015

OTHER PUBLICATIONS

International Search Report cited in PCT/CN2021/100579 dated Jul. 27, 2021, 4 pages.

*Primary Examiner* — Viet Q Nguyen
(74) *Attorney, Agent, or Firm* — Cooper Legal Group, LLC

(57) ABSTRACT

The present application provides a parameter setting method and apparatus, a system, and a storage medium. The parameter setting method includes: obtaining first setting values of multiple memory parameters and storage locations of the multiple memory parameters in a non-volatile memory; generating a first parameter setting instruction according to the first setting value and the storage location of each memory parameter; and sending the first parameter setting instruction to a test device, so that the test device sets the memory parameter stored at the storage location in the non-volatile memory as the first setting value.

12 Claims, 5 Drawing Sheets

(51) Int. Cl.
  *G01R 31/28* (2006.01)
  *G01R 31/3183* (2006.01)
(58) Field of Classification Search
  USPC .......................................................... 365/201
  See application file for complete search history.

(56) References Cited

U.S. PATENT DOCUMENTS

| | | | |
|---|---|---|---|
| 8,543,801 B2 | 9/2013 | Chu et al. | |
| 9,224,456 B2* | 12/2015 | Cometti | ................. G11C 16/06 |
| 10,014,056 B1* | 7/2018 | Lee | ...................... G11C 29/028 |
| 2006/0161829 A1* | 7/2006 | Kobayashi | ....... G01R 31/31919 |
| | | | 714/738 |

* cited by examiner

PARAMETER SETTING METHOD AND APPARATUS, SYSTEM, AND STORAGE MEDIUM

CROSS-REFERENCE TO RELATED APPLICATIONS

The present application claims the priority to Chinese Patent Application No. 202011034937.2, titled "PARAMETER SETTING METHOD AND APPARATUS, SYSTEM, AND STORAGE MEDIUM", filed with China National Intellectual Property Administration (CNIPA) on Sep. 27, 2020, which is incorporated herein by reference in its entirety.

TECHNICAL FIELD

The present application relates to the field of integrated circuit testing, and more specifically, to a parameter setting method and apparatus, a system, and a storage medium.

BACKGROUND

A double data rate synchronous dynamic random access memory (DDR SDRAM) is an SDRAM with a double data transmission rate. A data transmission rate of the DDR SDRAM is twice a system clock frequency, so the DDR SDRAM has relatively high performance.

During the design and production of the DDR SDRAM, the performance of the DDR SDRAM needs to be tested by a test device. In a process of testing the DDR SDRAM, the performance of the DDR SDRAM needs to be tested according to different parameters. The test device is usually a computer device or the like. In an existing test method, testing is usually conducted by manually operating a test device. A tester sets parameters in the DDR SDRAM by a program interface of a corresponding program of a basic input/output system (BIOS) in a computer, and tests the DDR SDRAM.

However, when the performance of the DDR SDRAM needs to be tested according to multiple groups of parameters, the existing test method needs to be adjusted. To be specific, the parameters need to be input to program interfaces of different basic input/output systems, and then testing is conducted. This parameter setting operation process is complex, leading to low parameter setting efficiency.

SUMMARY

According to a first aspect, the present application provides a parameter setting method. The parameter setting method is applied to a host computer, the host computer is connected to a test device, and the test device includes a non-volatile memory. The parameter setting method includes:

obtaining first setting values of multiple memory parameters and storage locations of the multiple memory parameters in a non-volatile memory;

generating a first parameter setting instruction according to the first setting value and the storage location of each memory parameter; and sending the first parameter setting instruction to the test device, so that the test device sets the memory parameter stored at the storage location in the non-volatile memory as the first setting value.

According to a second aspect, the present application provides a parameter setting apparatus. The parameter setting apparatus includes:

an obtaining module, configured to obtain first setting values of multiple memory parameters and storage locations of the multiple memory parameters in a non-volatile memory;

a processing module, configured to generate a first parameter setting instruction according to the first setting value and the storage location of each memory parameter; and a sending module, configured to send the first parameter setting instruction to a test device, so that the test device sets the memory parameter stored at the storage location in the non-volatile memory as the first setting value.

According to a third aspect, the present application provides a test system, including:

a host computer, where the host computer includes an instruction memory and a processor, the instruction memory is configured to store instructions executable by the processor, and the processor is configured to implement the above parameter setting method; and at least one test device, where the test device is connected to the host computer, and the test device includes a non-volatile memory.

According to a fourth aspect, the present application provides a computer-readable storage medium. The computer-readable storage medium stores computer executable instructions, and the computer executable instructions are executed by a processor to implement the parameter setting method in the first aspect and the optional solutions.

DETAILED DESCRIPTION

To make the objectives, technical solutions, and advantages of the present application clearer, the following clearly and completely describes the technical solutions in the present application with reference to the accompanying drawings in the present application. Apparently, the described embodiments are some rather than all of the embodiments in the present application. All other embodiments obtained by persons of ordinary skill in the art based on the embodiments in the present application without creative efforts shall fall within the protection scope of the present application.

A test system used for testing a DDR SDRAM is usually a computer device. In the prior art, the DDR SDRAM is usually tested by manually operating a test device. In an existing test method, testing is usually conducted by manually operating a test device. A tester sets parameters in the DDR SDRAM by a program interface of a basic input/output system in a computer, and after setting the parameters, runs the test device to test the DDR SDRAM.

However, when the performance of the DDR SDRAM needs to be tested according to multiple groups of parameters, the existing test method needs to be adjusted. To be specific, the parameters need to be input to program interfaces of different basic input/output systems. Consequently, an operation process is complex, leading to low parameter setting efficiency.

Embodiments of the present application provides a parameter setting method and apparatus, a system, and a storage medium, to provide a more efficient parameter setting scheme. The inventive concept of the embodiments of the present application is: A host computer obtains storage locations of multiple memory parameters in a non-volatile memory and specific setting values of the parameters, generates a parameter setting instruction according to the storage locations and the setting data, and sends the parameter setting instruction to a test device, so that the host computer sets the memory parameters. In the present application, there is no need to modify parameters by a program interface of a basic input/output system, and multiple memory parameters can be modified at a time, improving the parameter setting efficiency.

In addition, because arrangements of data stored in non-volatile memories manufactured by different manufacturers are different, a storage location of a memory parameter cannot be directly obtained according to the parameter provided by a manufacturer. In the embodiments of the present application, a storage location of a memory parameter is obtained by comparing data that exists in a non-volatile memory before and after the memory parameter is set, and further a parameter setting instruction can be generated. In this way, the parameter setting efficiency is improved.

Figure 1:
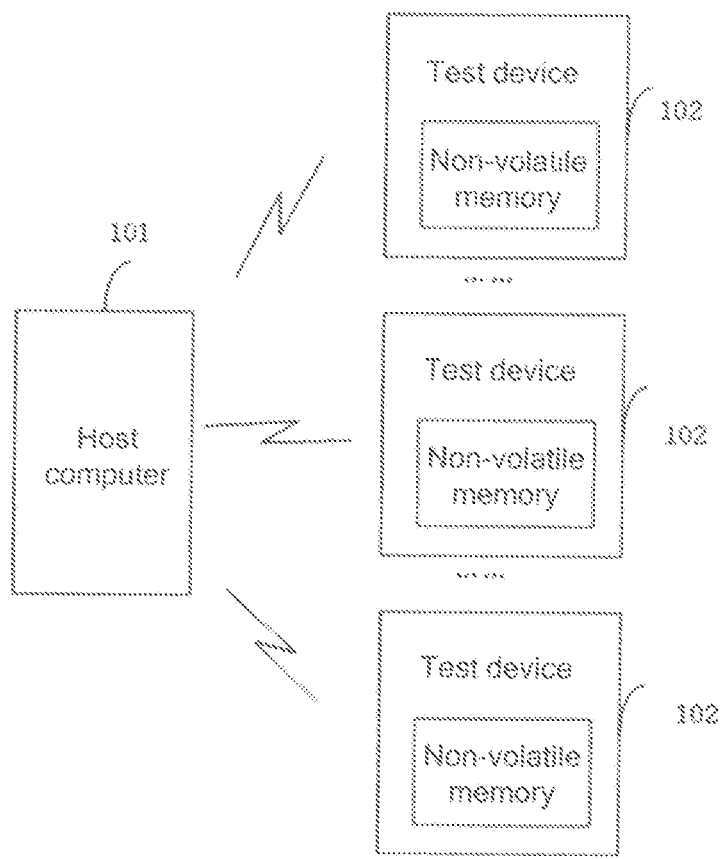
FIG. 1 is a schematic structural diagram of a test system according to an embodiment of the present application.

As shown in FIG. 1, a test system provided in an embodiment of the present application is used to test the performance of a to-be-tested memory. The test system includes a host computer 101 and multiple test devices 102. The host computer 101 is communicatively connected to each test device 102. Each test device 102 includes a non-volatile memory. Optionally, the non-volatile memory is an electrically erasable programmable read only memory (EEPROM). The non-volatile memory is configured to store basic input/output system programs.

When the test system is used to test the to-be-tested device, the to-be-tested device is connected to the test device. Optionally, when the test device is a desktop computer device or a portable computer device, the memory is installed in a built-in card slot of the computer device, or installed inside the computer device through patching.

A test process of the test system is divided into a parameter setting process before testing and a performance test process. In the parameter setting process before testing, the host computer obtains a storage location of a memory parameter in the non-volatile memory, then generates a parameter setting instruction according to the storage location and a setting value of the memory parameter, and sends the parameter setting instruction to the test device, so that the test device executes the parameter setting instruction to set the memory parameter in the non-volatile memory. In the performance test process, the host computer sends a test instruction, so that the test device conducts performance testing on the to-be-tested memory.

Figure 2:
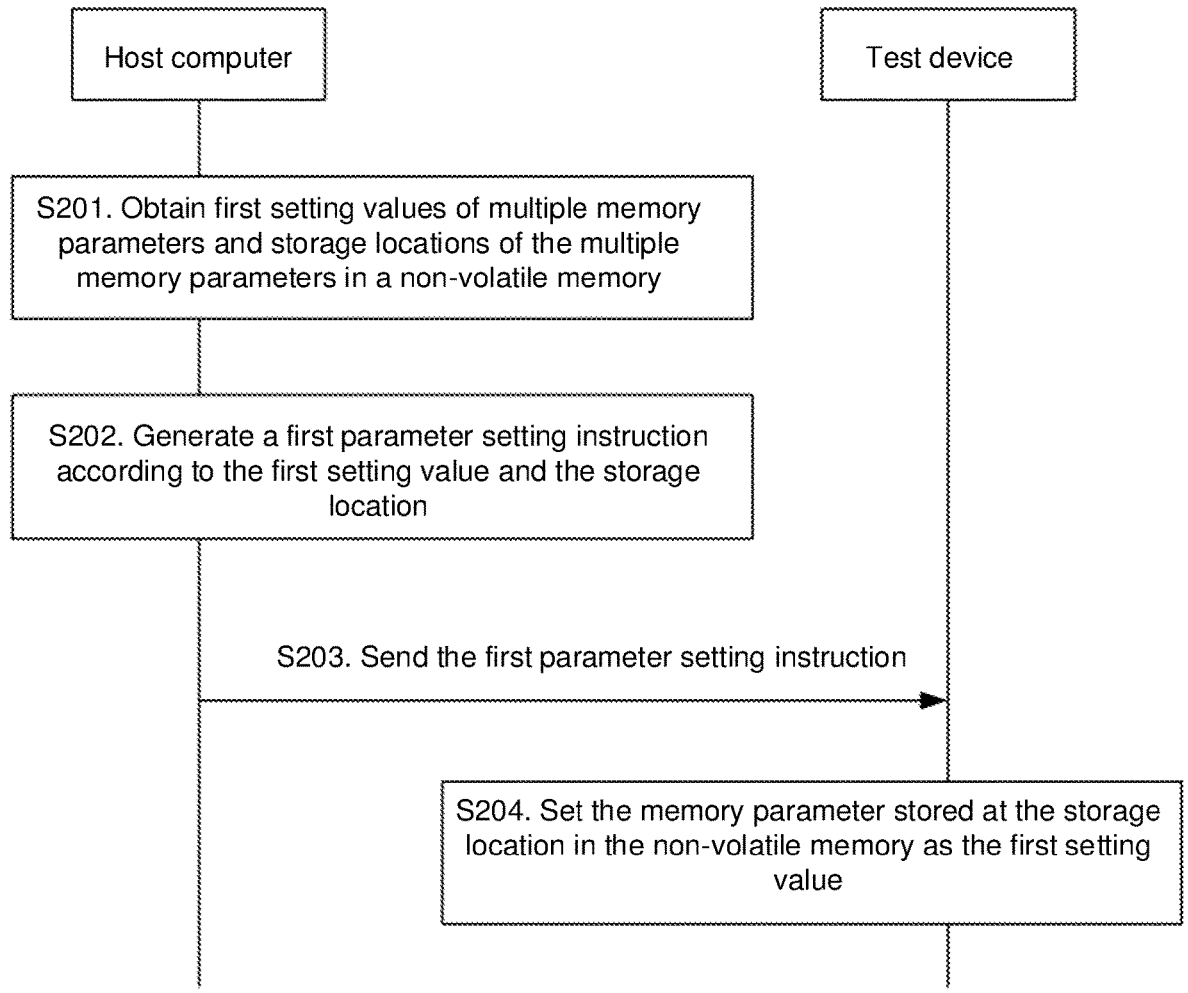
FIG. 2 is a schematic flowchart of a parameter setting method according to another embodiment of the present application.

As shown in FIG. 2, another embodiment of the present application provides a parameter setting method. The parameter setting method is applied to the foregoing test system. The parameter setting method includes the following steps:

S201. A host computer obtains first setting values of multiple memory parameters and storage locations of the multiple memory parameters in a non-volatile memory.

The memory parameter is a parameter of a to-be-tested memory. The memory parameter includes a timing parameter of the memory, such as a column address strobe (CAS) latency (tCL), a row active delay (tRAS), or a row address strobe (RAS) to CAS delay (tRCD).

The memory parameter is located in the non-volatile memory, and the first setting value of the memory parameter is determined according to a test requirement, and can be changed as the test requirement changes.

S202. The host computer generates a first parameter setting instruction according to the first setting value and the storage location of each memory parameter.

The host computer compiles the first setting value and the storage location of each memory parameter in a preset compilation manner to obtain the first parameter setting instruction.

S203. The host computer sends the first parameter setting instruction to a test device.

S204. The test device sets the memory parameter stored at the storage location in the non-volatile memory as the first setting value.

After receiving the first parameter setting instruction, the test device parses the first parameter setting instruction to obtain the storage location of the memory parameter and the setting value of the memory parameter, and sets data stored at the storage location in the non-volatile memory as the first setting value, to set the memory parameter stored at the storage location as the first setting value. The test device is restarted, and the parameter setting takes effect.

In the parameter setting method provided in this embodiment of the present application, the storage locations of the multiple memory parameters are obtained, so that the parameter setting instruction is generated according to the storage location and the setting value of the memory parameter, and the host computer sets the memory parameters. In the present application, multiple memory parameters can be modified at a time, improving the parameter setting efficiency.

Another embodiment of the present application provides a parameter setting method. The parameter setting method is also applied to the foregoing test system. The parameter setting method includes the following steps:

S301. A host computer obtains first setting values of multiple memory parameters and storage locations of the multiple memory parameters in a non-volatile memory.

Figure 3:
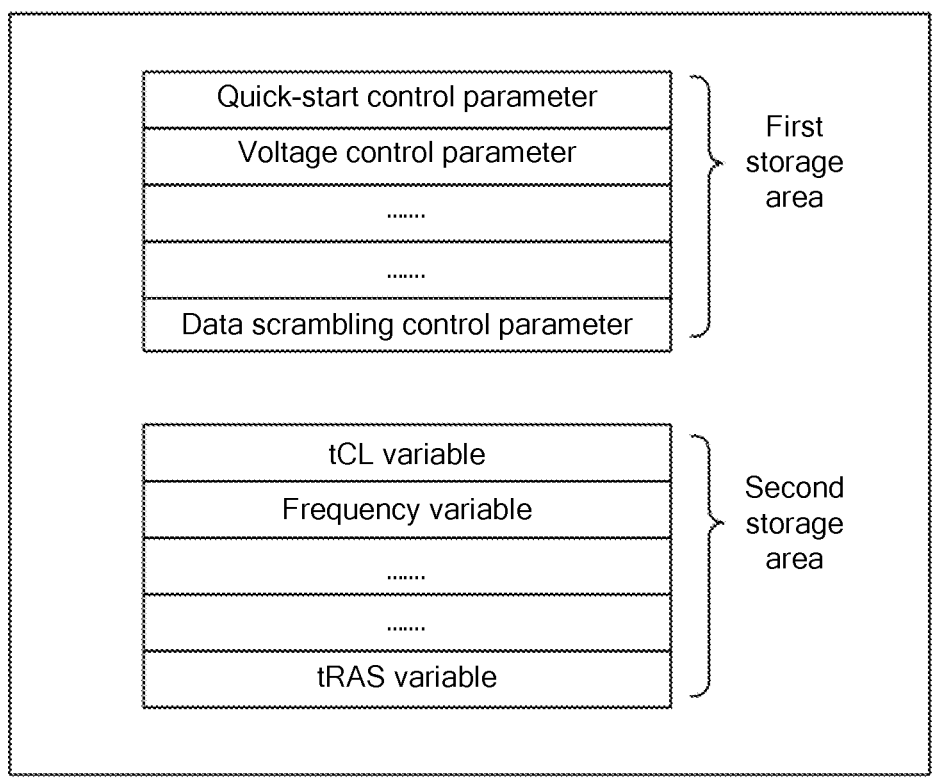
FIG. 3 is a schematic diagram of data storage in a non-volatile memory according to another embodiment of the present application.

As shown in FIG. 3, the non-volatile memory is provided with a first storage area and a second storage area. The first storage area is used to store control parameters including a quick-start control parameter, a voltage control parameter, a data scrambling control parameter, and the like. The second storage area is used to store system variables including a tCL variable, a frequency variable, and a tRAS variable. In other words, the memory parameters are also located in the first storage area and the second storage area.

Before a memory parameter is set in the non-volatile memory, a value in a storage area in which the memory parameter is located is displayed as auto (Auto). Therefore, values in two storage areas in the non-volatile memory can be compared to obtain a storage location of the memory parameter in the non-volatile memory.

The storage locations of the multiple memory parameters in the non-volatile memory can be obtained in the following manner, including: for each memory parameter, obtaining first data and second data, where the first data is data stored in the non-volatile memory before the memory parameter is set, and the second data is data stored in the non-volatile memory after the memory parameter is set; and obtaining a storage location of the memory parameter in the non-volatile memory according to the first data and the second data. Parameter setting operations may be directly conducted on the test device 102 to obtain the first data and the second data; or the test device 102 is controlled, through a remote connection to the host computer 101, to conduct parameter setting operations on the test device 102 to obtain the first data and second data.

Optionally, the first data and the second data are compared to obtain a changed parameter, and the storage location of the memory parameter in the non-volatile memory is obtained according to a storage location of the changed parameter in the first data or the second data.

S302. The host computer generates a first parameter setting instruction according to the first setting value and the storage location of each memory parameter.

The host computer compiles the first setting value and the storage location of each memory parameter to obtain the first parameter setting instruction.

S303. The host computer sends the first parameter setting instruction to a test device.

S304. The test device sets the memory parameter stored at the storage location in the non-volatile memory as the first setting value.

The test device parses the first parameter setting instruction to obtain the storage location and the setting value of the memory parameter, and sets data at the storage location in the non-volatile memory as the first setting value, to set the memory parameter stored at the storage location as the first setting value.

In the parameter setting method provided in this embodiment of the present application, the storage locations of the multiple memory parameters are obtained according to data that exists in the non-volatile memory before and after the parameters of the to-be-tested memory are set, and further the parameter setting instruction can be generated according to the storage locations and the setting values of the multiple memory parameters, so that the host computer sets the multiple memory parameters at the same time. In this way, the parameter setting efficiency is improved.

Another embodiment of the present application provides a parameter setting method. The parameter setting method is also applied to the foregoing test system. The parameter setting method includes the following steps:

S401. A host computer obtains first setting values of multiple memory parameters and storage locations of the multiple memory parameters in a non-volatile memory.

During obtaining of the storage locations of the multiple memory parameters in the non-volatile memory, for each memory parameter, first data and second data are obtained. A storage location of the memory parameter in the non-volatile memory is obtained according to the first data and the second data.

The non-volatile memory is provided with a first storage area and a second storage area. The first memory area is used to store control parameters, and the second memory area is used to store system variables.

Optionally, the first data may be obtained in the following manner, including: obtaining the first data stored in the first memory area and the second memory area before the memory parameter is set.

Optionally, the second data can be obtained in the following manner, including: controlling the test device to obtain a second setting value of the memory parameter, wherein the second setting value is input by a display interface, where the display interface is a display interface of the test device, and a user inputs the second setting value of the memory parameter on the display interface; generating a second parameter setting instruction according to the second setting value and a preset instruction template, where the second parameter setting instruction is used to set the memory parameter stored in the non-volatile memory, and after the test device is restarted, the parameter setting takes effect; and obtaining the second data stored in the non-volatile memory after the test device executes the second parameter setting instruction.

Optionally, the second data stored in the first memory area and the second memory area after the test device executes the second parameter setting instruction is obtained.

After the first data and the second data are obtained, the first data and the second data are compared to obtain a changed parameter to determine the location of the memory parameter according to a location of the changed parameter in the first data or the second data.

S402. The host computer generates a first parameter setting instruction according to the first setting value and the storage location of each memory parameter.

S403. The host computer sends the first parameter setting instruction to a test device.

S404. The test device sets the memory parameter stored at the storage location in the non-volatile memory as the first setting value.

S402 to S404 have been described in detail in the foregoing embodiment, and details are not described herein again.

In the parameter setting method provided in this embodiment of the present application, the memory parameter is set by the display interface of the test device, to obtain the second data that exists after the memory parameter is set, and then the storage location of the memory parameter can be finally obtained according to the data that exists before and after the memory parameter is set. The host computer can generate the parameter setting instruction according to the storage location and the setting data, and set the multiple memory parameters at the same time, thereby improving the parameter setting efficiency.

Figure 4:
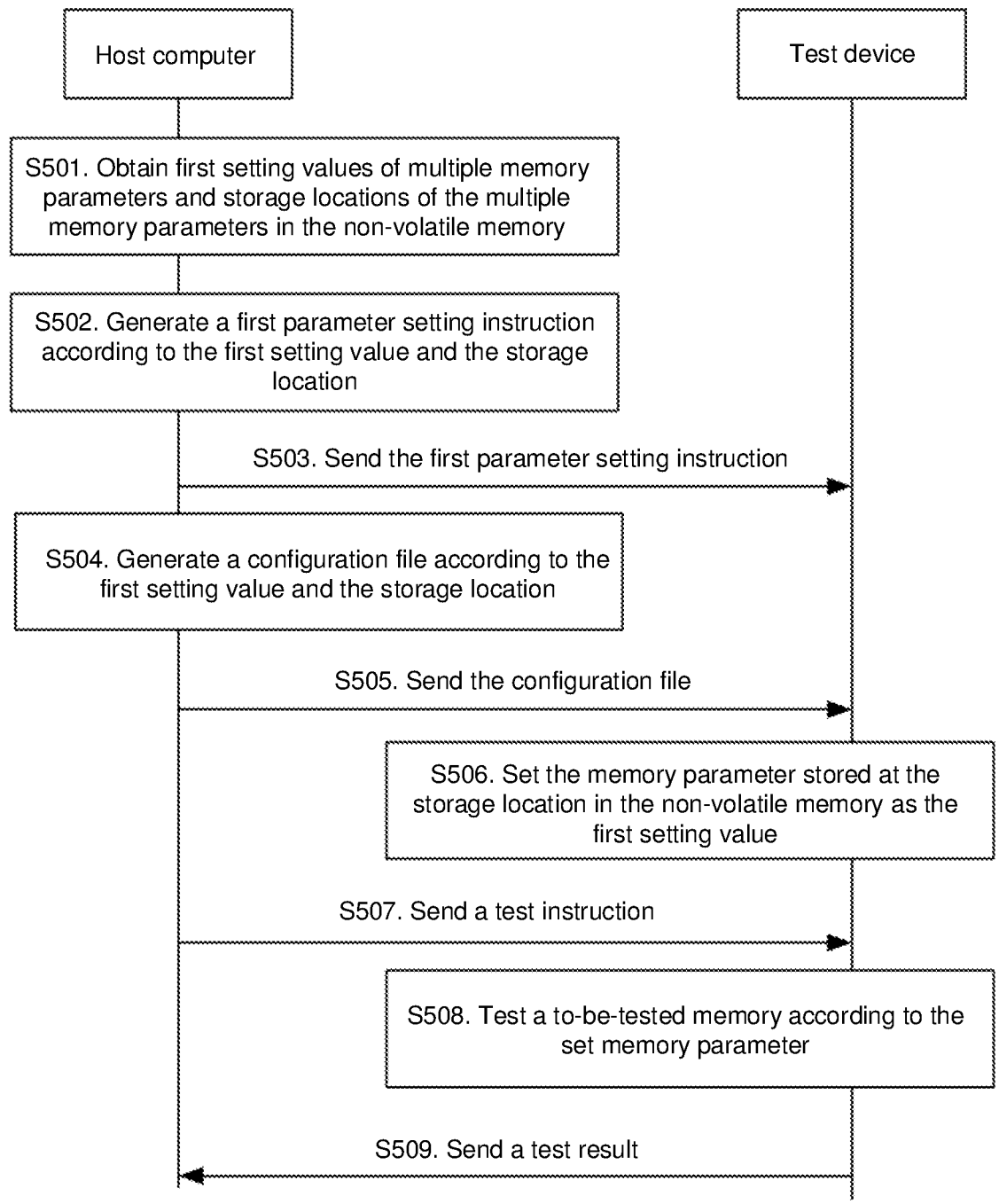
FIG. 4 is a schematic flowchart of a parameter setting method according to another embodiment of the present application.

As shown in FIG. 4, another embodiment of the present application provides a parameter setting method. The parameter setting method is also applied to the foregoing test system. The parameter setting method includes the following steps:

S501. A host computer obtains first setting values of some memory parameters stored in a non-volatile memory and storage locations of the memory parameters in the non-volatile memory.

During problem analysis of a to-be-tested memory, only values of some memory parameters in the to-be-tested memory and storage locations of the memory parameters may be set. Further, the impact of the set memory parameters on the performance of the to-be-tested memory may be analyzed.

S502. The host computer generates a first parameter setting instruction according to the first setting value and the storage location of each memory parameter.

The host computer compiles the first setting values and the storage locations of some memory parameters to obtain the first parameter setting instruction.

S503. The host computer sends the first parameter setting instruction to a test device.

S504. The host computer generates a configuration file according to the first setting value and the storage location of each memory parameter.

After receiving the configuration file and the first parameter setting instruction, the test device sets the memory parameter according to the first parameter setting instruction and the configuration file. In other words, during execution of the parameter setting instruction, the storage location and the first setting value of the memory parameter are read from the configuration file, and the memory parameter in the non-volatile memory is set according to the data read from the configuration file.

It should be noted that this step does not have to be conducted after S503, provided that this step is conducted between S501 and S506.

S505. The host computer sends the configuration file to the test device.

S506. The test device sets the memory parameter stored at the storage location in the non-volatile memory as the first setting value.

The test device reads the storage location and the first setting value of the memory parameter from the configuration file when executing the parameter setting instruction, and sets data at a corresponding storage location in the non-volatile memory as the first setting value according to the data read from the configuration file, to implement setting of the memory parameters.

S507. The host computer sends a generated test instruction.

After the test device executes the first parameter setting instruction, the test device can be restarted, and the parameter setting can take effect. The host computer obtains an actual value of the memory parameter in the non-volatile memory of the test device, and determines whether the actual value of the memory parameter is the same as the first setting value. If it is determined that the actual value of the memory parameter is different from the first setting value, steps S501 to S506 need to be repeated to set the memory parameter again. If it is determined that the actual value of the memory parameter is the same as the first setting value, the test instruction may be sent.

S508. The test device tests the to-be-tested memory according to the set memory parameters.

After receiving the test instruction, the test device executes the test instruction, and tests the to-be-tested memory according to the set memory parameters to obtain a test result.

S509. The test device sends the test result.

It should be noted that, to analyze the test result, usually, S501 to S507 are conducted in a loop. A setting value of one memory parameter increases progressively. A test result of the memory parameter corresponding to each setting value is obtained. In this way, the impact of the parameter of the to-be-tested memory on its performance can be determined by analyzing the test result.

A tCL parameter of a DDR SDAM is used as an example. When S501 to S507 are conducted for the first time, a setting value of tCL is 10, a test result of the to-be-tested memory when tCL is set to 10 is obtained, then the setting value of tCL is increased by 1, and S501 to S507 are conducted again to obtain a test result of the to-be-tested memory when tCL is set to 11. S501 to S507 are successively conducted in a loop iteratively until tCL is equal to 20. Then, obtained test results are analyzed, and an optimal value of tCL can be found. Alternatively, the impact of tCL on the performance of the to-be-tested memory is analyzed. Optimal values of other parameters can also be obtained by this method.

In the parameter setting method provided in this embodiment of the present application, the storage locations of the multiple memory parameters are obtained, so that the parameter setting instruction is generated according to the storage location and the setting value, to set the multiple parameters. This improves the parameter setting efficiency, thereby improving the test efficiency of the memory.

Figure 5:
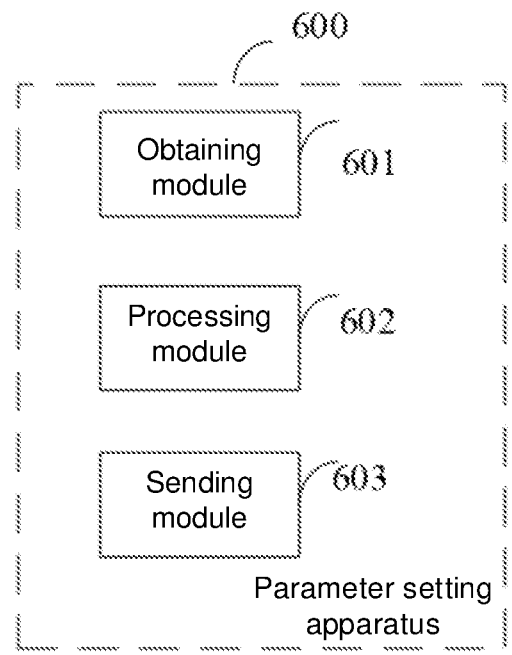
FIG. 5 is a schematic structural diagram of a parameter setting apparatus according to another embodiment of the present application.

As shown in FIG. 5, the present application provides a parameter setting apparatus 600. The apparatus 600 includes:

an obtaining module 601, configured to obtain first setting values of multiple memory parameters and storage locations of the multiple memory parameters in a non-volatile memory;

a processing module 602, configured to generate a first parameter setting instruction according to the first setting value and the storage location of each memory parameter; and a sending module 603, configured to send the first parameter setting instruction to a test device, so that the test device sets the memory parameter stored at the storage location in the non-volatile memory as the first setting value.

Optionally, the obtaining module 601 is specifically configured to:

obtain first data and second data for each memory parameter, where the first data is data stored in the non-volatile memory before the memory parameter is set, and the second data is data stored in the non-volatile memory after the memory parameter is set; and obtain a storage location of the memory parameter in the non-volatile memory according to the first data and the second data.

Optionally, the obtaining module 601 is specifically configured to:

control the test device to obtain a second setting value of the memory parameter, wherein the second setting value is input by a display interface;

generate a second parameter setting instruction according to the second setting value and a preset instruction template, where the second parameter setting instruction is used to set the memory parameter stored in the non-volatile memory; and obtain the second data stored in the non-volatile memory after the test device executes the second parameter setting instruction.

Optionally, the obtaining module 601 is specifically configured to:

obtain the second data stored in a first memory area and a second memory area after the test device executes the second parameter setting instruction, where the non-volatile memory includes the first memory area and the second memory area, the first memory area is used to store control parameters, and the second memory area is used to store system variables.

Optionally, the obtaining module 601 is specifically configured to:

obtain the first data stored in the first memory area and the second memory area before the memory parameter is set.

Optionally, the obtaining module 601 is specifically configured to:

compare the first data and the second data to obtain a changed parameter; and obtain the storage location of the memory parameter in the non-volatile memory according to a storage location of the changed parameter in the first data or the second data.

Optionally, the obtaining module 601 is specifically configured to:

obtain first setting values of some memory parameters stored in the non-volatile memory and storage locations of the memory parameters in the non-volatile memory.

Optionally, the processing module 602 is specifically configured to: generate a configuration file according to the first setting value and the storage location of each memory parameter; and the sending module 603 is further configured to send the configuration file to the test device, where the first parameter setting instruction is used to instruct the test device to set the memory parameter according to the configuration file.

Optionally, the test device is connected to a to-be-tested memory, and the obtaining module 601 is further configured to:

obtain a test result obtained after the test device tests the to-be-tested memory, where the test result is obtained after the test device tests the to-be-tested memory according to the set memory parameter.

Figure 6:
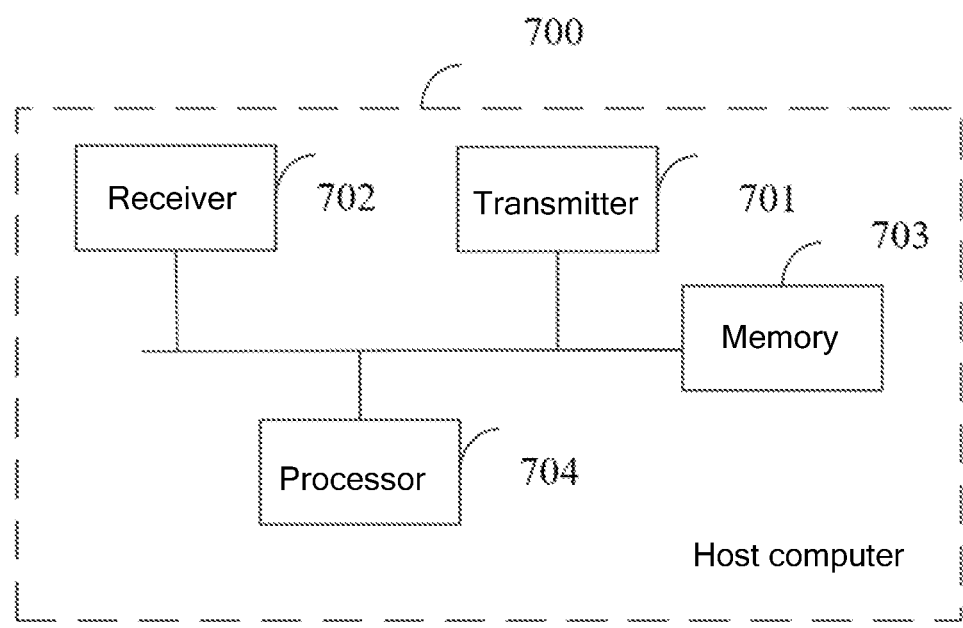
FIG. 6 is a schematic structural diagram of a host computer according to another embodiment of the present application.

As shown in FIG. 6, a host computer 700 provided in another embodiment of the present application includes a transmitter 701, a receiver 702, a memory 703, and a processor 704.

The transmitter 701 is configured to send instructions and data.

The receiver 702 is configured to receive the instructions and the data.

The memory 703 is configured to store computer executable instructions.

The processor 704 is configured to execute the computer executable instructions stored in the memory to implement the steps conducted in the parameter setting methods in the foregoing embodiments. For details, refer to the related description in the foregoing parameter setting method embodiments.

Optionally, the memory 703 may be independent or integrated with the processor 704. When the memory 703 is disposed independently, the host computer further includes a bus configured to connect the memory 703 to the processor 704.

The present application provides a computer-readable storage medium. The computer-readable storage medium stores a computer executable instruction, and the computer executable instruction is executed by a processor to implement the steps conducted in the parameter setting method in the foregoing embodiment. For details, refer to the related description in the foregoing parameter setting method embodiments.

Finally, it should be noted that the above embodiments are merely used to explain the technical solutions of the present application, but are not intended to limit the present application. Although the present application is described in detail with reference to the foregoing embodiments, persons of ordinary skill in the art should understand that they can still modify the technical solutions described in the foregoing embodiments, or make equivalent replacements on some or all technical features therein. These modifications or replacements do not make the essence of the corresponding technical solutions deviate from the scope of the technical solutions of the embodiments of the present application.

The invention claimed is:

1. A parameter setting method, wherein the parameter setting method is applied to a host computer, the host computer is connected to a test device, and the test device comprises a non-volatile memory; and the parameter setting method comprises:

obtaining first setting values of multiple memory parameters and storage locations of the multiple memory parameters in the non-volatile memory;

generating a first parameter setting instruction according to a first setting value and a storage location of each memory parameter among the multiple memory parameters; and sending the first parameter setting instruction to the test device, so that the test device sets the each memory parameter stored at the storage location in the non-volatile memory as the first setting value of the first setting values;

wherein the obtaining storage locations of the multiple memory parameters in the non-volatile memory comprises:

obtaining first data and second data for the each memory parameter, wherein the first data is data stored in the non-volatile memory before the each memory parameter is set, and the second data is data stored in the non-volatile memory after the each memory parameter is set; and obtaining the storage location of the each memory parameter in the non-volatile memory according to the first data and the second data;

wherein the obtaining second data comprises:

controlling the test device to obtain a second setting value of the each memory parameter, wherein the second setting value is input by a display interface;

generating a second parameter setting instruction according to the second setting value and a preset instruction template, wherein the second parameter setting instruction is used to set the each memory parameter stored in the non-volatile memory; and obtaining the second data stored in the non-volatile memory after the test device executes the second parameter setting instruction;

wherein the obtaining the second data stored in the non-volatile memory after the test device executes the second parameter setting instruction comprises:

obtaining the second data stored in a first memory area and a second memory area after the test device executes the second parameter setting instruction, wherein the non-volatile memory comprises the first memory area and the second memory area, the first memory area is used to store control parameters, and the second memory area is used to store system variables.

2. The parameter setting method according to claim 1, wherein the obtaining first data comprises:

obtaining the first data stored in the first memory area and the second memory area before the each memory parameter is set.

3. The parameter setting method according to claim 1, wherein the obtaining the storage location of the each memory parameter in the non-volatile memory according to the first data and the second data comprises:

comparing the first data and the second data, to obtain a changed parameter; and obtaining the storage location of the each memory parameter in the non-volatile memory according to a storage location of the changed parameter in the first data or the second data.

4. The parameter setting method according to claim 1, wherein the obtaining first setting values of multiple memory parameters and storage locations of the multiple memory parameters in the non-volatile memory comprises:
obtaining first setting values and storage locations of some of the multiple memory parameters stored in the non-volatile memory.

5. The parameter setting method according to claim 1, wherein the parameter setting method further comprises:
generating a configuration file according to the first setting value and the storage location of the each memory parameter; and
sending the configuration file to the test device, wherein the first parameter setting instruction is used to instruct the test device to set the each memory parameter according to the configuration file.

6. The parameter setting method according to claim 1, wherein the test device is connected to a to-be-tested memory, and after setting the each memory parameter stored in the non-volatile memory according to the first parameter setting instruction, the parameter setting method further comprises:
obtaining a test result obtained after the test device tests the to-be-tested memory, wherein the test result is obtained after the test device tests the to-be-tested memory according to the multiple memory parameters.

7. A parameter setting apparatus, wherein the parameter setting apparatus comprises:
an obtaining module, configured to obtain first setting values of multiple memory parameters and storage locations of the multiple memory parameters in a non-volatile memory;
a processing module, configured to generate a first parameter setting instruction according to a first setting value and a storage location of each memory parameter among the multiple memory parameters; and
a sending module, configured to send the first parameter setting instruction to a test device, so that the test device sets the each memory parameter stored at the storage location in the non-volatile memory as the first setting value of the first setting values;
wherein the obtaining module is configured to:
obtain first data and second data for the each memory parameter, wherein the first data is data stored in the non-volatile memory before the each memory parameter is set, and the second data is data stored in the non-volatile memory after the each memory parameter is set; and
obtain the storage location of the each memory parameter in the non-volatile memory according to the first data and the second data;
wherein the obtaining module is configured to:
control the test device to obtain a second setting value of the each memory parameter, wherein the second setting value is input by a display interface;
generate a second parameter setting instruction according to the second setting value and a preset instruction template, wherein the second parameter setting instruction is used to set the each memory parameter stored in the non-volatile memory; and
obtain the second data stored in the non-volatile memory after the test device executes the second parameter setting instruction;
wherein the obtaining module is configured to:
obtain the second data stored in a first memory area and a second memory area after the test device executes the second parameter setting instruction,
wherein the non-volatile memory comprises the first memory area and the second memory area, the first memory area is used to store control parameters, and the second memory area is used to store system variables.

8. The parameter setting apparatus according to claim 7, wherein the obtaining module is configured to:
obtain the first data stored in the first memory area and the second memory area before the each memory parameter is set.

9. A test system, comprising:
the host computer, wherein the host computer comprises an instruction memory and a processor, the instruction memory is configured to store instructions executable by the processor, and the processor is configured to implement the parameter setting method according to claim 1; and
at least one test device, wherein the test device is connected to the host computer, and the test device comprises the non-volatile memory.

10. The test system according to claim 9, wherein the non-volatile memory comprises an electrically erasable programmable read only memory, and the electrically erasable programmable read only memory is configured to store a basic input/output system.

11. The test system according to claim 9, wherein the test system further comprises a to-be-tested memory, and the to-be-tested memory is connected to the test device.

12. A non-transitory computer-readable storage medium, wherein the non-transitory computer-readable storage medium stores computer executable instructions, and the computer executable instructions are executed by a processor to implement the parameter setting method according to claim 1.

* * * * *